United States Patent
Kim et al.

(10) Patent No.: US 12,422,473 B2
(45) Date of Patent: Sep. 23, 2025

(54) HIGH TEMPERATURE TEST DEVICE OF SEMICONDUCTOR MEMORY MODULE AND METHOD FOR CONTROLLING MODULE TEMPERATURE THEREOF

(71) Applicant: Samsung Electronics Co., Ltd., Suwon-si (KR)

(72) Inventors: Sunhee Kim, Suwon-si (KR); Sun-Gi Lee, Suwon-si (KR); Soo-In Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 169 days.

(21) Appl. No.: 18/378,594

(22) Filed: Oct. 10, 2023

(65) Prior Publication Data

US 2024/0369622 A1 Nov. 7, 2024

(30) Foreign Application Priority Data

May 2, 2023 (KR) .................. 10-2023-0056881

(51) Int. Cl.
*G01R 31/28* (2006.01)

(52) U.S. Cl.
CPC ..... *G01R 31/2877* (2013.01); *G01R 31/2875* (2013.01); *G01R 31/2889* (2013.01)

(58) Field of Classification Search
CPC .......... G01R 31/2874; G01R 31/2875; G01R 31/2877
USPC .................................................. 324/750.03
See application file for complete search history.

(56) References Cited

U.S. PATENT DOCUMENTS

| | | | |
|---|---|---|---|
| 7,111,211 B1* | 9/2006 | Co ............... | G01R 31/2855 714/724 |
| 2009/0020618 A1* | 1/2009 | Gutierrez ........ | G05D 23/025 236/94 |
| 2018/0361667 A1* | 12/2018 | Sternå .............. | B33Y 50/02 |
| 2019/0237152 A1 | 8/2019 | Lee et al. | |
| 2020/0326736 A1 | 10/2020 | Yeh et al. | |
| 2021/0325450 A1* | 10/2021 | Yu ................. | G01R 31/2874 |
| 2023/0091699 A1* | 3/2023 | Opdahl .............. | F27D 19/00 |
| 2023/0133368 A1* | 5/2023 | Kim ................ | G01R 31/2865 324/724 |

(Continued)

FOREIGN PATENT DOCUMENTS

KR 10-0950701 B1 3/2010
KR 10-2011-0088614 A 8/2011

(Continued)

*Primary Examiner* — Roberto Velez
(74) *Attorney, Agent, or Firm* — Muir Patent Law, PLLC (57) ABSTRACT

Disclosed is a high temperature test device of a memory module. The high temperature test device includes: an airtight housing configured to seal the memory module mounted on a main board; a heater disposed above the main board inside the airtight housing; a first fan disposed on an upper portion of the airtight housing above the heater and configured to send heat from the heater to the memory module; a second fan disposed on the upper portion of the airtight housing and configured to send air inside the airtight housing to the outside of the airtight housing; and a temperature controller configured to adjust an output ratio of the first fan to the second fan during the mounting test of the memory module to manage a module temperature of the memory module to be maintained within a specified range.

20 Claims, 7 Drawing Sheets

(56) References Cited

U.S. PATENT DOCUMENTS

2023/0402341 A1* 12/2023 An .................... H01L 22/12

FOREIGN PATENT DOCUMENTS

| KR | 10-2019-0091097 A | 8/2019 |
| KR | 10-2398395 B1 | 5/2022 |
| KR | 10-2022-0120796 A | 8/2022 |

* cited by examiner

| Tm | Output of heater | Output of fan 1 | Output of fan 2 | Output ratio of fan 1 and fan 2 |
|---|---|---|---|---|
| T1 | H1 | Fa1 | Fb1 | R1 |
| T2 | H2 | Fa2 | Fb2 | R2 |
| T3 | H3 | Fa3 | Fb3 | R3 |
| T4 | H4 | Fa4 | Fb4 | R4 |
| T5 | H5 | Fa5 | Fb5 | R5 |
| ... | ... | ... | ... | ... |
| T_n | H_n | Fa_n | Fb_n | R_n |

HIGH TEMPERATURE TEST DEVICE OF SEMICONDUCTOR MEMORY MODULE AND METHOD FOR CONTROLLING MODULE TEMPERATURE THEREOF

CROSS-REFERENCE TO RELATED APPLICATIONS

This application claims priority under 35 U.S.C. § 119 to Korean Patent Application No. 10-2023-0056881 filed on May 2, 2023, in the Korean Intellectual Property Office, the disclosures of which are incorporated by reference herein in their entireties.

BACKGROUND

Embodiments of the present disclosure described herein relate to a test device of a semiconductor memory module, and more particularly, relate to a high temperature test device of a semiconductor memory module and a method for controlling a module temperature thereof.

Semiconductor memory devices may be generally classified into volatile semiconductor memory devices and nonvolatile semiconductor memory devices. The volatile semiconductor memory devices are fast in read and write speeds but loses data stored therein when power is not supplied thereto. In contrast, even though power is interrupted, information stored in a nonvolatile semiconductor memory device does not disappear. For this reason, the nonvolatile semiconductor memory devices are used to store information that has to be retained regardless of whether power is supplied thereto.

In general, a semiconductor memory module may refer to a component comprising a circuit by arranging a plurality of semiconductor elements and electronic elements on a substrate. The semiconductor memory module may be tested in various environments to check for abnormalities. A process of mounting and testing the semiconductor memory module on a main board actually used by a consumer is called a mounting test process. A high temperature test among the mounting test processes may test whether the semiconductor memory module normally operates in a high temperature environment by heating the semiconductor memory module to a high temperature. As an example of a method of performing such high temperature test, there is a method of performing a test by mounting the semiconductor memory module in a sealed heating chamber and then heating the semiconductor memory module to a specified temperature.

However, the high temperature test in the sealed heating chamber may be suitable for testing low-capacity memory modules with low self-heating by using a method of heating to a specified temperature and then stopping heating, but may not be suitable for testing high-capacity memory modules with high self-heating.

SUMMARY

Embodiments of the present disclosure provide a high temperature test device including a housing for sealing a memory module, a first fan for intake air, and a second fan for exhaust air, so that the module temperature of the memory module may be finely adjusted during a mounting test of the memory module.

Embodiments of the present disclosure provide a high temperature test device directly receiving a module temperature of a memory module from a main board on which the memory module is mounted to monitor the module temperature of the memory module in real time.

Embodiments of the present disclosure provide a high temperature test device managing life cycle of the high temperature test device through monitoring states of configurations of the high temperature test device.

According to an embodiment, a high temperature test device includes: an airtight housing configured to seal the memory module mounted on a main board; a heater disposed above the main board inside the airtight housing; a first fan disposed on an upper portion of the airtight housing above the heater and configured to send heat from the heater to the memory module; a second fan disposed on the upper portion of the airtight housing and configured to send air inside the airtight housing to the outside of the airtight housing; and a temperature controller configured to adjust an output ratio of the first fan to the second fan during a mounting test of the memory module to manage a module temperature of the memory module to be maintained within a specified range. The temperature controller periodically receives the module temperature from the main board, and adjusts the output ratio of the first fan to the second fan based on a deviation between the module temperature and a target temperature.

According to an embodiment, a high temperature test device includes: an airtight housing configured to seal the memory module mounted on a main board; a heater disposed above the main board inside the airtight housing; a first fan disposed on an upper portion of the airtight housing above the heater and configured to send heat from the heater to the memory module; a second fan disposed on the upper portion of the airtight housing and configured to send air inside the airtight housing to the outside of the airtight housing; and a temperature controller configured to control the heater, the first fan and the second fan during a mounting test of the memory module to manage a module temperature of the memory module to be maintained within a specified range. The temperature controller stores a correlation table corresponding to a change in at least one of outputs of the heater, the first fan and the second fan, and a change in the module temperature.

According to an embodiment, a module temperature control method of a high temperature test device controlling a temperature of a memory module during a mounting test includes receiving a target temperature from a test controller; raising a module temperature of the memory module to the target temperature through a heater disposed above the memory module; periodically receiving the module temperature from a main board on which the memory module is mounted; increasing an output of a first fan supplying air to the memory module through the heater when the module temperature is less than a first reference temperature; increasing an output of a second fan circulating air inside an airtight housing configured to seal the memory module to the outside of the airtight housing when the module temperature exceeds a second reference temperature; and maintaining outputs of the first fan and the second fan identically when the module temperature is greater than or equal to the first reference temperature and less than or equal to the second reference temperature.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that an ordinary one in the art easily implements the invention.

Below, a DRAM will be used as an example for illustrating features and functions of the present disclosure. However, other features and performances may be easily understood from information disclosed herein by a person of ordinary skill in the art. The present disclosure may be implemented by other embodiments or applied thereto. Further, the detailed description/features may be modified or changed according to viewpoints and applications without escaping from the scope, spirit, and other objects of the present disclosure.

Figure 1:
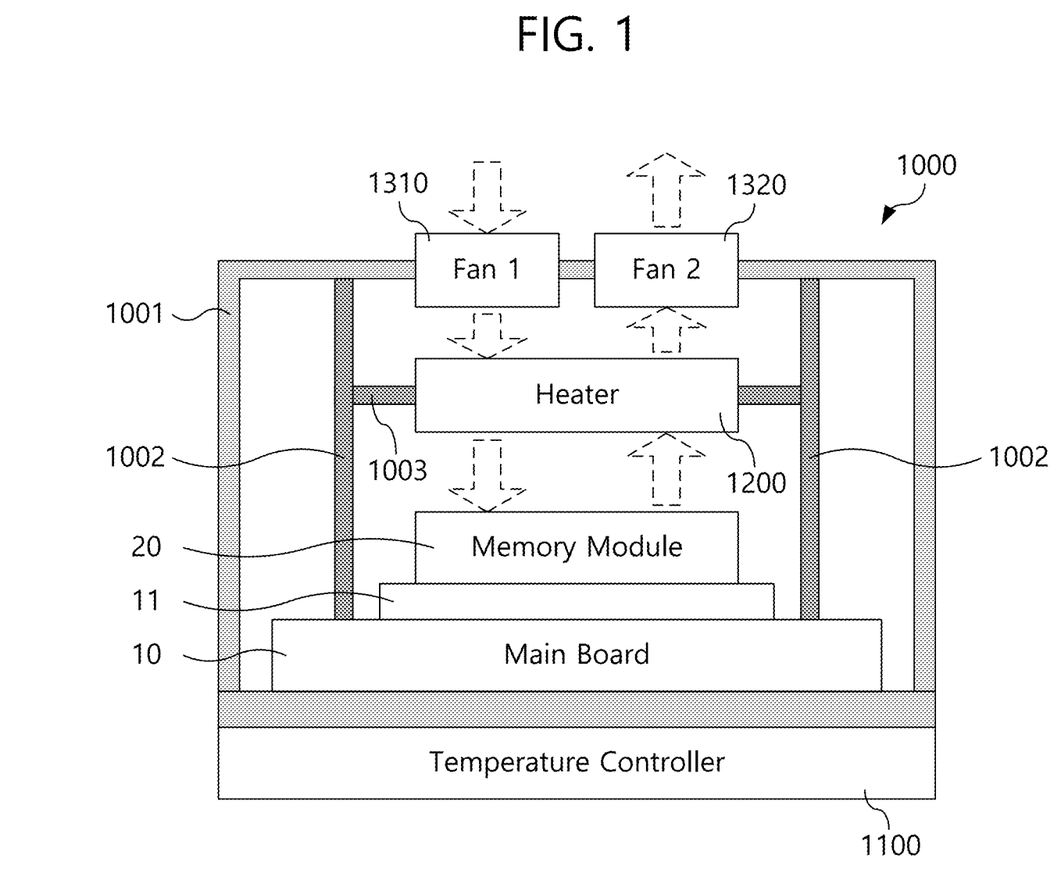
FIG. 1 is a diagram illustrating a configuration of a high temperature test device for creating a high temperature environment to test a memory module according to an example embodiment.

FIG. 1 is a diagram illustrating a configuration of a high temperature test device for creating a high temperature environment to test a memory module according to an example embodiment. Referring to FIG. 1, a high temperature test device 1000 may include a main housing 1001, an airtight housing 1002, a temperature controller 1100, a heater 1200, a first fan 1310, and a second fan 1320.

According to an example embodiment, a mounting test of a memory module 20 may be performed within the high temperature test device 1000. For example, a main board 10 may be mounted in the high temperature test device 1000. As an example, the main board 10 may be a customer's main board for the mounting test of the memory module 20. The memory module 20, which is an object of the mounting test, may be mounted in a memory slot 11 of the main board 10. As an example, the main board 10 may include a plurality of memory slots 11. A plurality of memory modules 20 may be mounted in the plurality of memory slots 11 respectively. The high temperature test device 1000 may be manufactured in a one-to-one custom format corresponding to the main board 10.

According to an example embodiment, the high temperature test device 1000 may provide a sealed environment for the mounting test of the memory module 20. For example, the main housing 1001 may support components of the high temperature test device 1000 (for example, the airtight housing 1002, the heater 1200, the first fan 1310 and the second fan 1320). The airtight housing 1002 may be disposed inside a portion of the main housing 1001 to provide the sealed environment to the memory module 20. For example, the airtight housing 1002 may provide a room to the memory module 20 airtightly isolated from the outside of the airtight housing 1002. The airtight housing 1002 may be disposed to surround the memory module 20. The airtight housing 1002 may seal the memory module 20 by blocking/isolating it from the outside (e.g., airtightly). As an example, the airtight housing 1002 may be placed in contact with a part of the main board 10 to create the sealed environment. Other components of the main board 10 except for the memory slot 11 (for example, a central processing unit of the main board 10) may be disposed between the airtight housing 1002 and the main housing 1001.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

According to an example embodiment, the high temperature test device 1000 may include components for controlling a temperature of the memory module 20. For example, the heater 1200 may be disposed above the memory module 20. The heater 1200 may be disposed between the memory module 20 and the first fan 1310 (and/or the second fan 1320) through a support member (e.g., a support) 1003 coupled to the airtight housing 1002 (e.g., extending from an inner surface of the airtight hosing 1002). The first fan 1310 and the second fan 1320 may be disposed above the heater 1200. The first fan 1310 and the second fan 1320 may be disposed on an upper surface of the main housing 1001.

According to an example embodiment, the high temperature test device 1000 may control a temperature of the memory module 20. For example, the heater 1200 may generate heat at a specified temperature. The first fan 1310 may move air into the housing 1001. The second fan 1320 may move air to the outside of the airtight housing 1002. Air moved into the airtight housing 1002 by the first fan 1310 may be delivered to the memory module 20 through the heater 1200. Accordingly, the temperature controller 1100 may increase the temperature of the memory module 20 by increasing an output of the first fan 1310. Air is moved to the outside of the airtight housing 1002 by the second fan 1320, and the temperature inside the airtight housing 1002 may decrease. Accordingly, the temperature controller 1100 may decrease the temperature of the memory module 20 by increasing an output of the second fan 1320. The temperature controller 1100 may adjust an output ratio of the first fan 1310 to the second fan 1320 to change the temperature of the memory module 20 by a specified unit temperature (for example, 1 degree Celsius). Alternatively, the temperature controller 1100 may adjust an output of the heater 1200. Alternatively, the temperature controller 1100 may finely adjust the temperature of the memory module 20 by adjusting an output of the heater 1200 with outputs of the first fan 1310 and the second fan 1320.

Hereinafter, the high temperature test device 1000 may be described based on a configuration having an arrangement structure of FIG. 1.

Figure 2:
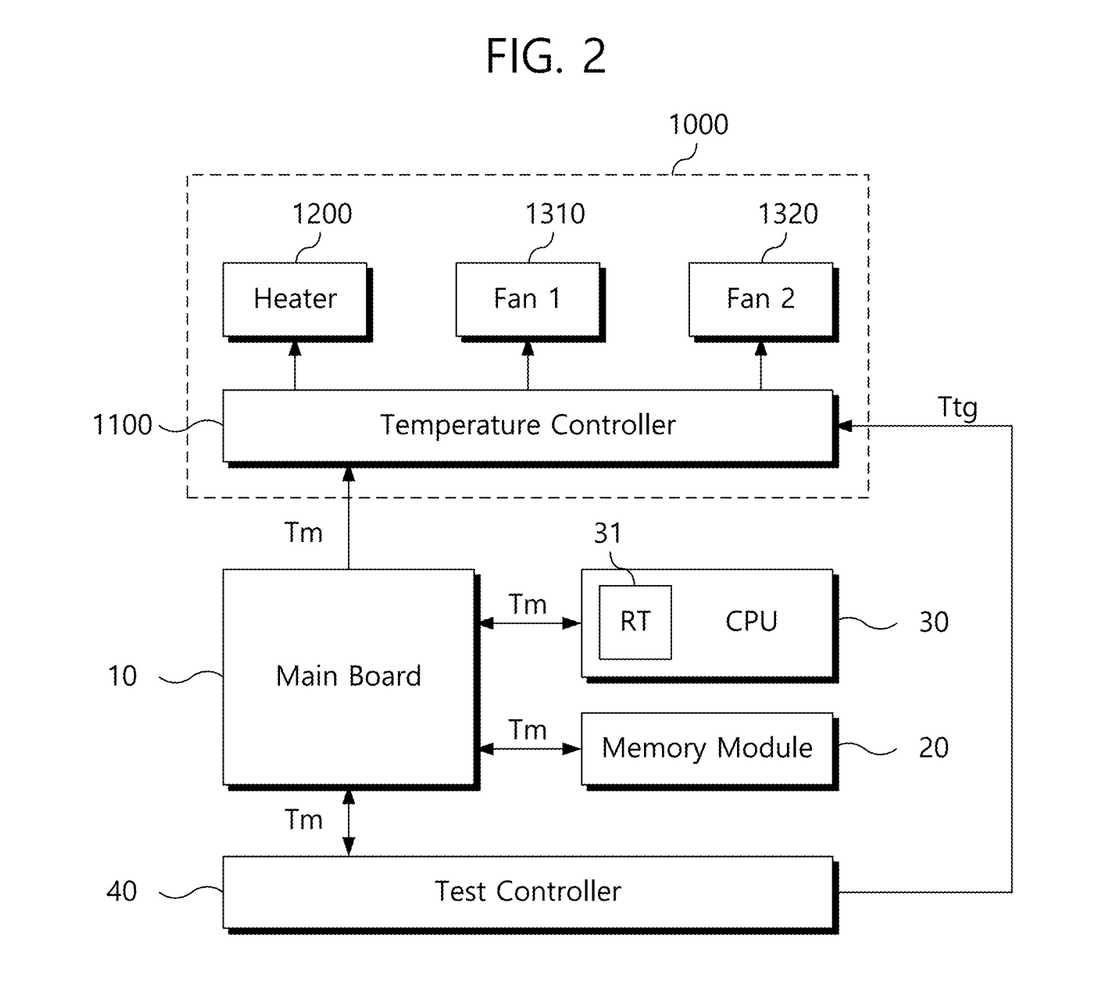
FIG. 2 is a block diagram illustrating an operation of the high temperature test device of FIG. 1.

FIG. 2 is a block diagram illustrating an operation of the high temperature test device of FIG. 1. Referring to FIGS. 1 and 2, the temperature controller 1100 may manage the heater 1200, the first fan 1310, and the second fan 1320 during a mounting test to control the module temperature Tm of the memory module 20.

According to an example embodiment, the module temperature Tm of the memory module 20 may be measured in real time. For example, the memory module 20 may include an embedded temperature sensor, and the embedded temperature sensor may measure the module temperature Tm of the memory module 20 in real time. The memory module 20 may transmit the module temperature Tm to the main board 10. The main board 10 may transmit the module temperature Tm to a central processing unit (CPU) 30 mounted on the main board 10. The CPU 30 may include a register 31 and store the module temperature Tm in the register 31.

According to an example embodiment, the test controller 40 may control the overall mounting test of the memory module 20. For example, after the memory module 20 is mounted on the main board 10 and the memory module 20 is sealed (e.g., isolated from the outside) by the airtight housing 1002, the test controller 40 may transmit a target temperature Ttg to the temperature controller 1100. The test controller 40 may check/confirm the module temperature Tm from the main board 10. As an example, the test controller 40 may read the module temperature Tm stored in the register 31 by using a temperature checking/confirmation tool (for example, readTSOD) that accesses the register 31 of the CPU 30. When the module temperature Tm reaches the target temperature Ttg, the test controller 40 may start the mounting test of the memory module 20. When the mounting test of the memory module 20 is finished, the test controller 40 may transmit a mounting test finished signal to the temperature controller 1100.

According to an example embodiment, the temperature controller 1100 may increase the module temperature Tm of the memory module 20 to the target temperature Ttg before the mounting test of the memory module 20 starts. For example, the temperature controller 1100 may receive the target temperature Ttg from the test controller 40. Upon receiving the target temperature Ttg, the temperature controller 1100 may operate the heater 1200 at a specified temperature and may operate the first fan 1310 with a specified output. The temperature controller 1100 may directly check/confirm the module temperature Tm from the main board 10. As an example, the temperature controller 1100 may read the module temperature Tm stored in the register 31 by using the temperature checking/confirmation tool (for example, readTSOD) which accesses the register 31 of the CPU 30. When the module temperature Tm reaches the target temperature Ttg, the temperature controller 1100 may perform an operation to maintain the module temperature Tm at the target temperature Ttg.

According to an example embodiment, the temperature controller 1100 may monitor the module temperature Tm of the memory module 20 during the mounting test of the memory module 20. For example, the temperature controller 1100 may periodically check/confirm the module temperature Tm of the memory module 20. The temperature controller 1100 may directly receive the module temperature Tm of the memory module 20 from the main board 10 through the temperature checking/confirmation tool (for example, readTSOD) without going through (e.g., without involving) the test controller 40. The temperature controller 1100 may periodically check/confirm the module temperature Tm of the memory module 20, e.g., in every specified unit time (for example, at regular intervals, e.g., 1 second).

According to an example embodiment, the temperature controller 1100 may manage the module temperature Tm of the memory module 20 during the mounting test of the memory module 20. For example, the temperature controller 1100 may maintain the module temperature Tm of the memory module 20 at the target temperature Ttg until the mounting test of the memory module 20 is completed. The temperature controller 1100 may set a reference temperature around the target temperature Ttg.

As an example, the temperature controller 1100 may compare the module temperature Tm of the memory module 20 with a first reference temperature. When the module temperature Tm of the memory module 20 is less than the first reference temperature, the temperature controller 1100 may perform a heat enhancement. The temperature controller 1100 may increase an output of the first fan 1310 more than the second fan 1320. For example, the temperature controller 1100 may change an output ratio of the first fan 1310 to the second fan 1320 so that the output of the first fan 1310 may increase. Alternatively, the temperature controller 1100 may increase an output of the heater 1200. Alternatively, the temperature controller 1100 may increase outputs of the first fan 1310 and the heater 1200 together.

As an example, the temperature controller 1100 may compare the module temperature Tm of the memory module 20 with a second reference temperature. When the module temperature Tm of the memory module 20 exceeds the second reference temperature, the temperature controller 1100 may perform a heat exhaust. The temperature controller 1100 may increase an output of the second fan 1320 more than the first fan 1310. For example, the temperature controller 1100 may change an output ratio of the first fan 1310 to the second fan 1320 so that the output of the second fan 1320 may increase. Alternatively, the temperature controller 1100 may decrease the output of the heater 1200. Alternatively, the temperature controller 1100 may increase the output of the second fan 1320 and decrease the output of the heater 1200.

For example, when the module temperature Tm of the memory module 20 is greater than or equal to the first reference temperature and less than or equal to the second reference temperature, the temperature controller 1100 may perform a steady temperature operation. The temperature controller 1100 may equally maintain or change the outputs of the first fan 1310 and the second fan 1320. For example, the temperature controller 1100 may match the outputs of the first fan 1310 and the second fan 1320 to the same (for example, fifty-fifty). Alternatively, the temperature controller 1100 may maintain the output ratio of the first fan 1310 to the second fan 1320 at which the module temperature Tm of the memory module 20 is maintained steady (e.g., substantially the same).

Terms such as "same," "equal," "planar," or "coplanar," as used herein encompass identicality or near identicality including variations that may occur, for example, acceptable variations. The term "substantially" may be used herein to emphasize this meaning, unless the context or other statements indicate otherwise.

According to an example embodiment, when the mounting test is finished, the temperature controller 1100 may stop the operation of the heater 1200, the first fan 1310 and the second fan 1320. For example, the temperature controller 1100 may check/confirm whether the mounting test finished signal is received. When receiving the mounting test termination signal from the test controller 40, the temperature controller 1100 may terminate the module temperature control operation. As an example, the temperature controller 1100 may stop the heater 1200 and the first fan 1310, and operate only the second fan 1320. The temperature controller 1100 may also stop the second fan 1320 when a specified time elapses. Alternatively, when the module temperature Tm of the memory module 20 drops below a specified temperature, the temperature controller 1100 may stop the second fan 1320.

Figure 3:
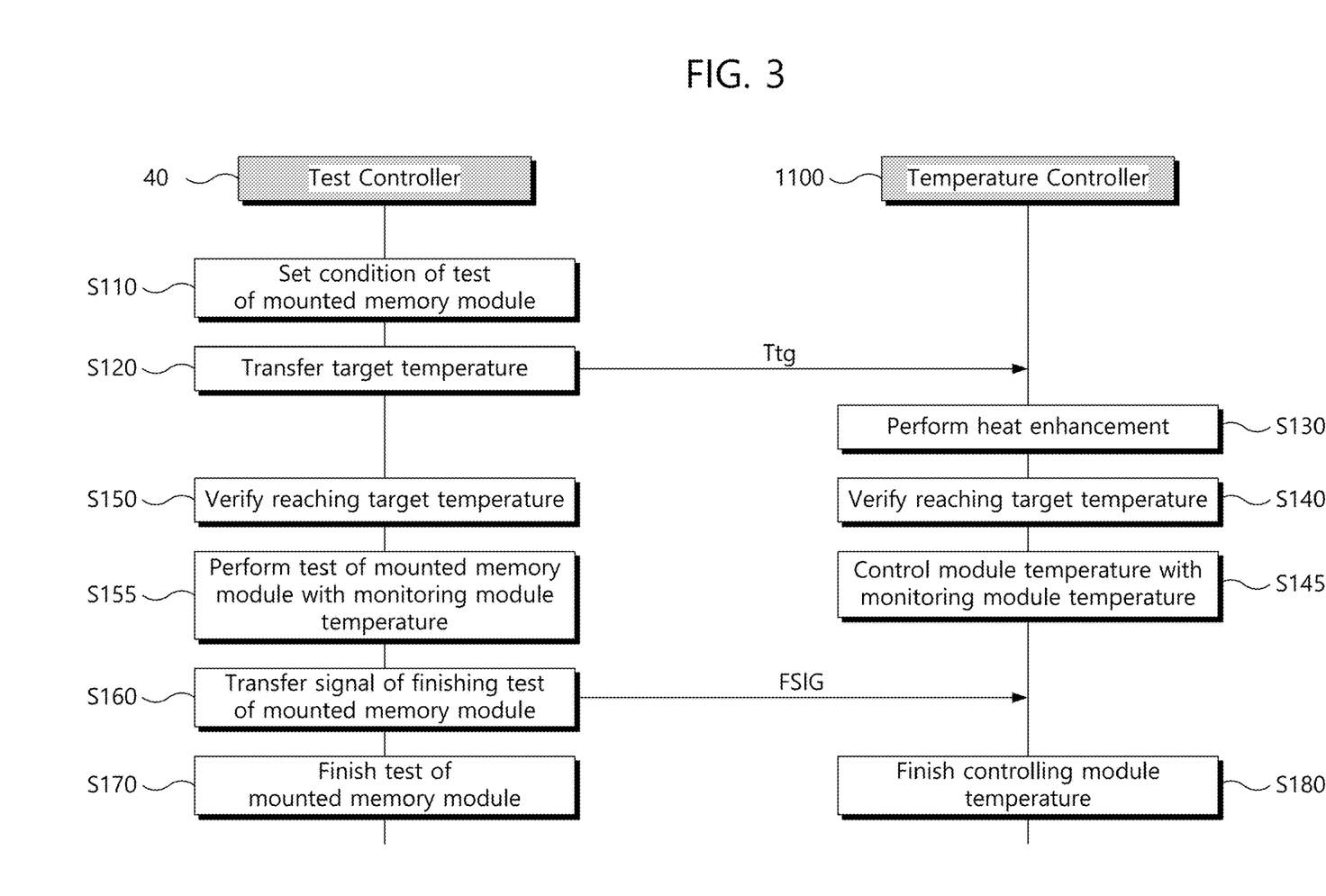
FIG. 3 is a flowchart illustrating operations of a test controller and a temperature controller during a mounting test of a memory module according to an example embodiment.

FIG. 3 is a flowchart illustrating operations of a test controller and a temperature controller during a mounting test of a memory module according to an example embodiment. Referring to FIGS. 1 to 3, when a mounting test of the memory module 20 is performed by the test controller 40, the temperature controller 1100 may control a module temperature Tm of the memory module 20.

According to an example embodiment, in operation S110, the test controller 40 may set conditions of the mounting test. For example, the test controller 40 may set a test list to be performed in the mounting test and/or a target temperature Ttg of the memory module 20 to be achieved/performed in the mounting test.

According to an example embodiment, in operation S120, the test controller 40 may transmit the target temperature Ttg of the memory module 20 set in operation S110 to the temperature controller 1100. The test controller 40 may temporarily wait to perform the mounting test until the module temperature Tm of the memory module 20 reaches the target temperature Ttg.

According to an example embodiment, in operation S130, the temperature controller 1100 may perform a heat enhancement (e.g., increase temperature). For example, when receiving the target temperature Ttg from the test controller 40, the temperature controller 1100 may operate the heater 1200. Furthermore, the temperature controller 1100 may operate the first fan 1310.

According to an example embodiment, in operation S140, the temperature controller 1100 may check/confirm whether the module temperature Tm of the memory module 20 reaches the target temperature Ttg. For example, the temperature controller 1100 may periodically receive the module temperature Tm of the memory module 20 from the main board 10, e.g., in every specified unit time (for example, in every 1 second). As an example, the temperature controller 1100 may operate the heater 1200 and the first fan 1310 at a maximum output until the module temperature Tm of the memory module 20 reaches the target temperature Ttg.

According to an example embodiment, in operation S145, the temperature controller 1100 may control the module temperature Tm of the memory module 20 while monitoring the module temperature Tm of the memory module 20. For example, the temperature controller 1100 may periodically receive the module temperature Tm of the memory module 20 from the main board 10, e.g., in every specified unit time (for example, 1 second) during the mounting test. The temperature controller 1100 may control the module temperature Tm of the memory module 20 by comparing the module temperature Tm of the memory module 20 with the target temperature Ttg in real time. As an example, the temperature controller 1100 may calculate a deviation between the module temperature Tm of the memory module 20 and the target temperature Ttg. When the deviation between the module temperature Tm and the target temperature Ttg of the memory module 20 is out of a specified range, the module temperature Tm of the memory module 20 may be controlled step by step in a specified unit temperature (for example, 1 degree Celsius) by adjusting outputs of the heater 1200, the first fan 1310 and the second fan 1320. As another example, the temperature controller 1100 may set reference temperatures based on the target temperature Ttg. The temperature controller 1100 may control the module temperature Tm of the memory module 20 in a specified unit temperature (for example, 1 degree Celsius) based on the reference temperatures.

According to an example embodiment, in operation S150, the test controller 40 may check/confirm whether the module temperature Tm of the memory module 20 reaches the target temperature Ttg. For example, the test controller 40 may periodically receive the module temperature Tm of the memory module 20 from the main board 10, e.g., in every specified unit time. For example, the test controller 40 may check/confirm the module temperature Tm of the memory module 20 in a unit time (for example, 5 seconds) different from that of the temperature controller 1100.

According to an example embodiment, in operation S155, the test controller 40 may perform the mounting test of the memory module 20 while monitoring the module temperature Tm of the memory module 20. For example, the test controller 40 may perform the mounting test of the memory module 20 according to the conditions set in operation S110.

According to an example embodiment, in operation S160, when the mounting test is completed, the test controller 40 may transmit a mounting test finished signal FSIG to the temperature controller 1100. In operation S170, the test controller 40 may finish the mounting test of the memory module 20.

According to an example embodiment, in operation S180, when receiving the mounting test finished signal FSIG, the temperature controller 1100 may finish the module temperature control operation. For example, the temperature controller 1100 may stop the heater 1200 and the first fan 1310, and operate only the second fan 1320. The temperature controller 1100 may also stop the second fan 1320 when a specified time elapses. Alternatively, when the module temperature Tm of the memory module 20 drops below a specified temperature, the temperature controller 1100 may stop the second fan 1320.

Figure 4:
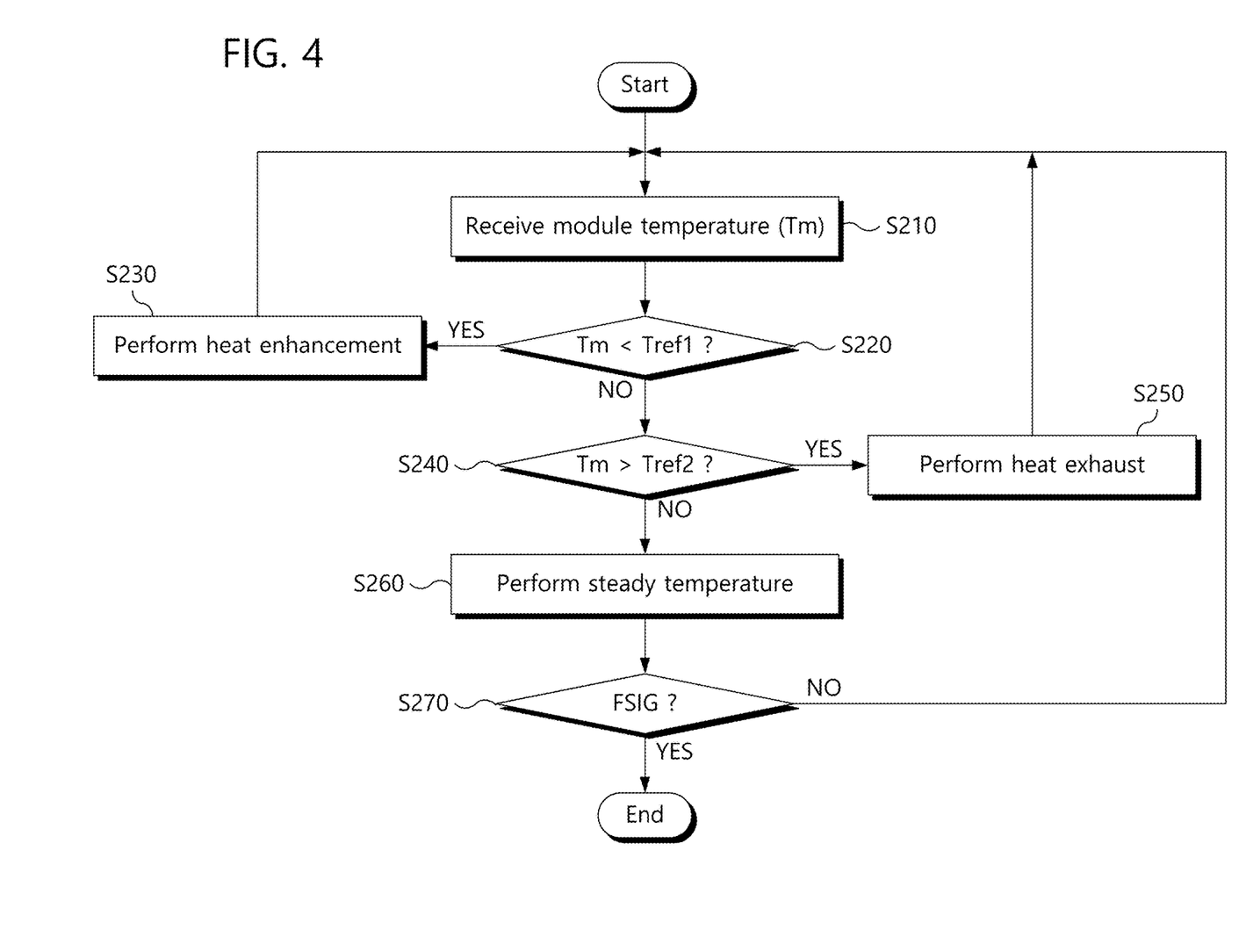
FIG. 4 is a flowchart illustrating a module temperature control operation of the temperature controller in FIG. 3.

FIG. 4 is a flowchart illustrating a module temperature control operation of the temperature controller in FIG. 3. Referring to FIGS. 1 to 4, operations of FIG. 4 may correspond to operation S145 of FIG. 3. In FIG. 3, while the test controller 40 is performing the mounting test, the temperature controller 1100 may control the heater 1200, the first fan 1310 and the second fan 1320 to manage a temperature of the memory module 20.

According to an example embodiment, in operation S210, the temperature controller 1100 may receive the module temperature Tm of the memory module 20. For example, the temperature controller 1100 may receive the module temperature Tm of the memory module 20 from the main board 10. As an example, the memory module 20 may include an embedded temperature sensor, and the embedded temperature sensor may measure the module temperature Tm of the memory module 20 in real time. The memory module 20 may transmit the module temperature Tm to the main board 10. The main board 10 may transmit the module temperature Tm to the CPU 30 mounted on the main board 10. The CPU 30 may include the register 31 and store the module temperature Tm in the register 31. The temperature controller 1100 may read the module temperature Tm stored in the register 31 by using the temperature checking/confirmation tool (for example, readTSOD) which accesses the register 31 of the CPU 30. The temperature controller 1100 may directly read the module temperature Tm through the temperature checking/confirmation tool, e.g., without going through the test controller 40. The temperature controller 1100 may periodically check/confirm the module temperature Tm of the memory module 20, e.g., in every specified unit time (for example, in every 1 second).

According to an example embodiment, in operation S220, the temperature controller 1100 may compare the module temperature Tm of the memory module 20 with a first reference temperature Tref1. For example, when the module temperature Tm of the memory module 20 is less than the first reference temperature Tref1, the temperature controller 1100 may perform operation S230. When the module temperature Tm of the memory module 20 is equal to or greater than the first reference temperature Tref1, the temperature controller 1100 may perform operation S240.

According to an example embodiment, in operation S230, when the module temperature Tm of the memory module 20 is less than the first reference temperature Tref1, the temperature controller 1100 may perform a heat enhancement. For example, the temperature controller 1100 may increase an output of the first fan 1310 more than the second fan 1320. For example, the temperature controller 1100 may change an output ratio of the first fan 1310 to the second fan 1320 so that the output of the first fan 1310 increases. Alternatively, the temperature controller 1100 may increase an output of the heater 1200. Alternatively, the temperature controller 1100 may increase outputs of the first fan 1310 and the heater 1200 together. For example, an output of a component of the present disclose may be an electrically output power of the component.

According to an example embodiment, in operation S240, the temperature controller 1100 may compare the module temperature Tm of the memory module 20 with a second reference temperature Tref2. When the module temperature Tm of the memory module 20 is greater than the second reference temperature Tref2, the temperature controller 1100 may perform operation S250. When the module temperature Tm of the memory module 20 is equal to or less than the second reference temperature Tref2, the temperature controller 1100 may perform operation S260.

According to an example embodiment, in operation S250, when the module temperature Tm of the memory module 20 is greater than the second reference temperature Tref2, the temperature controller 1100 may perform a heat exhaust. For example, the temperature controller 1100 may increase the output of the second fan 1320 to be more/higher than the output of the first fan 1310. For example, the temperature controller 1100 may change the output ratio of the first fan 1310 to the second fan 1320 so that the output of the second fan 1320 increases. Alternatively, the temperature controller 1100 may decrease the output of the heater 1200. Alternatively, the temperature controller 1100 may increase the output of the second fan 1320 and decrease the output of the heater 1200.

According to an example embodiment, in operation S260, when the module temperature Tm of the memory module 20 is greater than or equal to the first reference temperature Tref1 and less than or equal to the second reference temperature Tref2, the temperature controller 1100 may perform a steady temperature operation. For example, the temperature controller 1100 may maintain or change the outputs of the first fan 1310 and the second fan 1320 to be the same. For example, the temperature controller 1100 may match the outputs of the first fan 1310 and the second fan 1320 to the same (for example, fifty-fifty). Alternatively, the temperature controller 1100 may maintain the output ratio of the first fan 1310 to the second fan 1320 at which the module temperature Tm of the memory module 20 is maintained steady.

According to an example embodiment, in operation S270, the temperature controller 1100 may check/confirm whether the mounting test finished signal FSIG is received. For example, when receiving the mounting test finished signal FSIG from the test controller 40, the temperature controller 1100 may finish the module temperature control operation. When the mounting test finished signal FSIG is not received from the test controller 40, the temperature controller 1100 may repeatedly perform operations S210 to S260. Accordingly, the temperature controller 1100 may constantly maintain the module temperature Tm of the memory module 20 within a specified range (for example, between the first reference temperature Tref1 and the second reference temperature Tref2). As an example, the first reference temperature Tref1 and the second reference temperature Tref2 may be set such that the target temperature Ttg may be an intermediate value (e.g., a median value) of the specified range.

As described above, the temperature controller 1100 may control the first fan 1310 increasing the temperature of the memory module 20 and the second fan 1320 lowering the temperature of the memory module 20 together to adjust the temperature of the memory module 20. The temperature controller 1100 may adjust the module temperature Tm of the memory module 20 based on the output ratio of the first fan 1310 to the second fan 1320. Accordingly, the temperature controller 1100 may finely adjust the module temperature Tm of the memory module 20 (for example, in units of 1 degree Celsius). Since the module temperature Tm of the memory module 20 may be lowered through the second fan 1320, the high temperature test device 1000 may test not only a low-capacity memory module but also a high-capacity memory module with severe self-heating. In addition, the temperature controller 1100 may directly receive the module temperature Tm of the memory module 20 from the main board 10, and then the module temperature Tm of the memory module 20 may be monitored in small unit times (for example, 1 second unit), and the high temperature test device 1000 may reduce variation in the module temperature Tm of the memory module 20 during the mounting test of the memory module 20.

Figure 5:
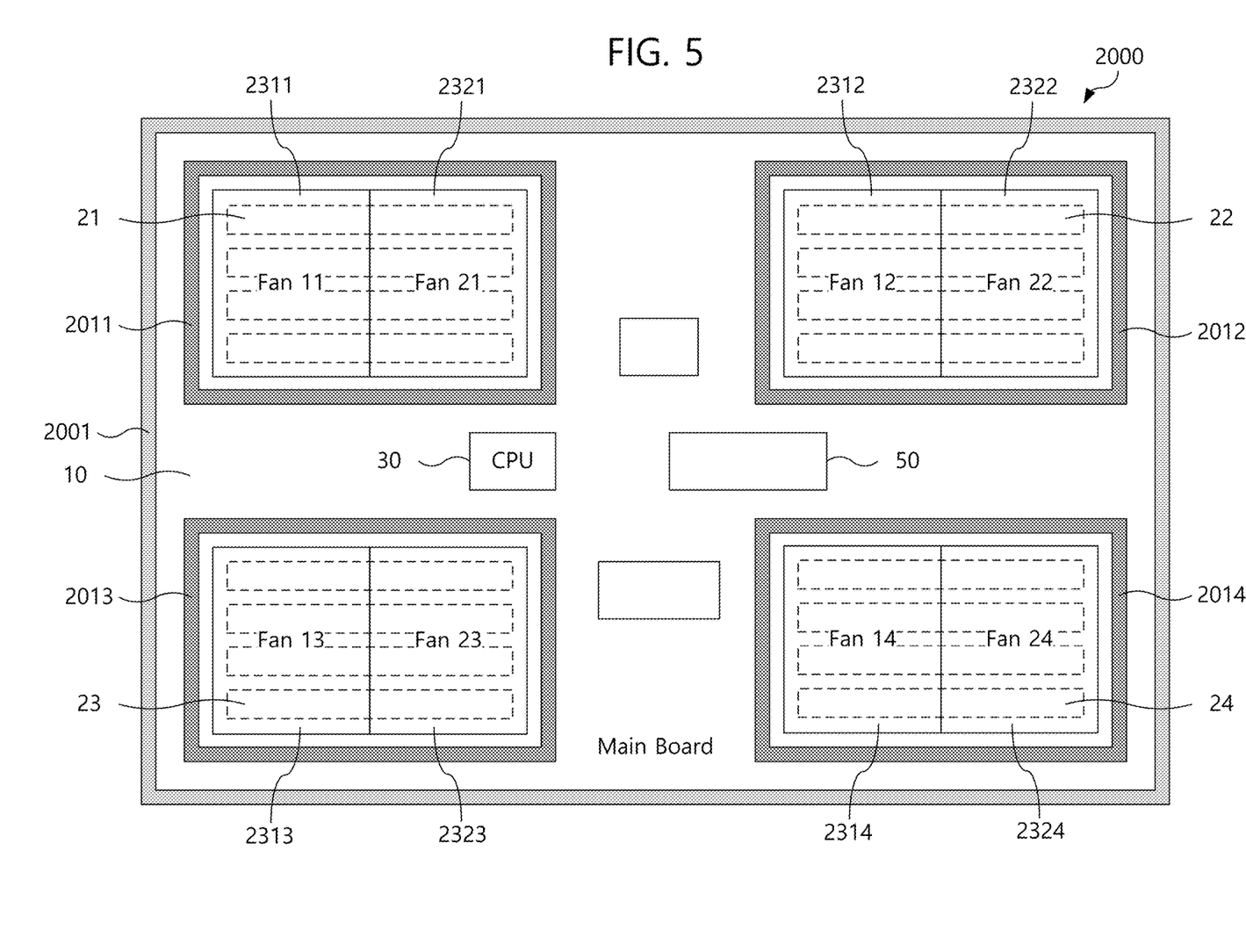
FIG. 5 is a diagram illustrating a configuration of a high temperature test device according to another example embodiment.

FIG. 5 is a diagram illustrating a configuration of a high temperature test device according to another example embodiment. FIG. 5 is a top view of the high temperature test device 2000. Referring to FIG. 5, the high temperature test device 2000 may include a main housing 2001, a plurality of airtight housings 2011, 2012, 2013, and 2014, a temperature controller (not shown) (for example, the temperature controller 1100 of FIG. 1), and a plurality of heaters (not shown) (for example, the heater 1200 of FIG. 1), a plurality of intake fans 2311, 2312, 2313, and 2314, and a plurality of exhaust fans 2321, 2322, 2323, and 2324.

According to an example embodiment, the high temperature test device 2000 may provide a sealed environment for a mounting test of a plurality of memory modules. For example, the main housing 2001 may support components of the high temperature test device 2000 (for example, the plurality of airtight housings 2011, 2012, 2013 and 2014, the temperature controller, the plurality of heaters, and the plurality of intake fans 2311, 2312, 2313 and 2314, and the plurality of exhaust fans 2321, 2322, 2323 and 2324. Each of the plurality of airtight housings 2011, 2012, 2013 and 2014 may be disposed to surround a corresponding group of a plurality of memory module groups 21, 22, 23 and 24. Each of the plurality of airtight housings 2011, 2012, 2013 and 2014 may seal a corresponding group of the plurality of memory module groups 21, 22, 23 and 24 by blocking/ isolating them from the outside. Except for the memory module, components mounted on the main board 10 (for example, a CPU 30 or at least one peripheral circuit 50) may not be sealed by the plurality of airtight housings 2011, 2012, 2013 and 2014. Accordingly, the CPU 30 or at least one peripheral circuit 50 may not be exposed to a high temperature environment for the mounting test.

According to an example embodiment, the high temperature test device 2000 may include components for controlling temperatures of a plurality of memory modules. For example, the plurality of memory modules may include a first memory module group 21, a second memory module group 22, a third memory module group 23, and/or a fourth memory module group 24. Each memory module group 21, 22, 23 and 24 may include at least one memory module. A first intake fan 2311 and a first exhaust fan 2321 may be disposed above the first memory module group 21. A first heater may be disposed between the first memory module group 21 and the first intake fan 2311 (and/or the first exhaust fan 2321). A second intake fan 2312 and a second exhaust fan 2322 may be disposed above the second memory module group 22. A second heater may be disposed between the second memory module group 22 and the second intake fan 2312 (and/or the second exhaust fan 2322). A third intake fan 2313 and a third exhaust fan 2323 may be disposed above the third memory module group 23. A third heater may be disposed between the third memory module group 23 and the third intake fan 2313 (and/or the third exhaust fan 2323). A fourth intake fan 2314 and a fourth exhaust fan 2324 may be disposed above the fourth memory module group 24. A fourth heater may be disposed between the fourth memory module group 24 and the fourth intake fan 2314 (and/or the fourth exhaust fan 2324).

According to an example embodiment, the high temperature test device 2000 may control module temperatures of the plurality of memory modules. For example, the plurality of heaters may generate heat of a specified temperature. The plurality of intake fans may increase the module temperatures of the plurality of memory modules through the plurality of heaters. As an example, the first intake fan 2311 may increase a first module temperature of the first memory module group 21 through the first heater. The second intake fan 2312 may increase a second module temperature of the second memory module group 22 through the second heater. The third intake fan 2313 may increase a third module temperature of the third memory module group 23 through the third heater. The fourth intake fan 2314 may increase a fourth module temperature of the fourth memory module group 24 through the fourth heater. The plurality of exhaust fans may lower the module temperatures of the plurality of memory modules. As an example, the first exhaust fan 2321 may lower the first module temperature of the first memory module group 21. The second exhaust fan 2322 may lower the second module temperature of the second memory module group 22. The third exhaust fan 2323 may lower the third module temperature of the third memory module group 23. The fourth exhaust fan 2324 may lower the fourth module temperature of the fourth memory module group 24.

According to an example embodiment, the temperature controller of the high temperature test device 2000 may finely adjust the module temperatures of the plurality of memory modules. For example, the temperature controller of the high temperature test device 2000 may control an output ratio of the first intake fan 2311 to the first exhaust fan 2321 to finely adjust the first module temperature of the first memory module group 21. The temperature controller of the high temperature test device 2000 may control the output ratio of the second intake fan 2312 to the second exhaust fan 2322 to finely adjust the second module temperature of the second memory module group 22. The temperature controller of the high temperature test device 2000 may control the output ratio of the third intake fan 2313 to the third exhaust fan 2323 to finely adjust the third module temperature of the third memory module group 23. The temperature controller of the high temperature test device 2000 may control the output ratio of the fourth intake fan 2314 to the fourth exhaust fan 2324 to finely adjust the fourth module temperature of the fourth memory module group 24.

According to an example embodiment, while performing the mounting test, the temperature controller of the high temperature test device 2000 may perform temperature control for each memory module group. For example, the temperature controller of the high temperature test device 2000 may receive a module temperature of each memory module from the main board 10. Based on the received module temperature, the temperature controller of the high temperature test device 2000 may perform different operations for each memory module group. As an example, the temperature controller of the high temperature test device 2000 may perform a heat enhancement for one memory module group and perform a heat exhaust for another memory module group. The temperature controller of the high temperature test device 2000 may perform a steady temperature for another memory module group.

As described above, the high temperature test device 2000 may receive the module temperatures of the plurality of memory modules from the main board 10, respectively. The high temperature test device 2000 may control the outputs of the plurality of intake fans and the plurality of exhaust fans so that each of the module temperatures of the plurality of memory modules may be kept constant within a specified range close to the target temperature. Accordingly, reliability of the high temperature test device 2000 may be improved.

Figure 6:
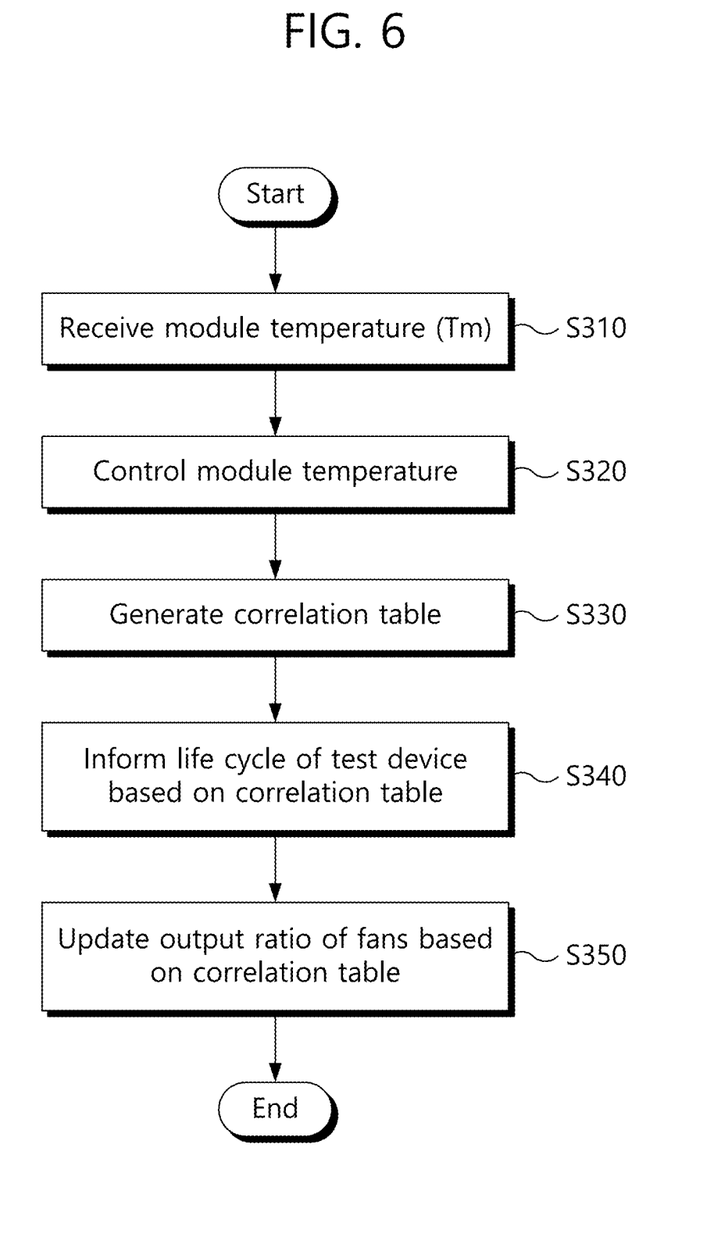
FIG. 6 is a flowchart illustrating a life cycle management method of a high temperature test device according to an example embodiment.
Figure 7:
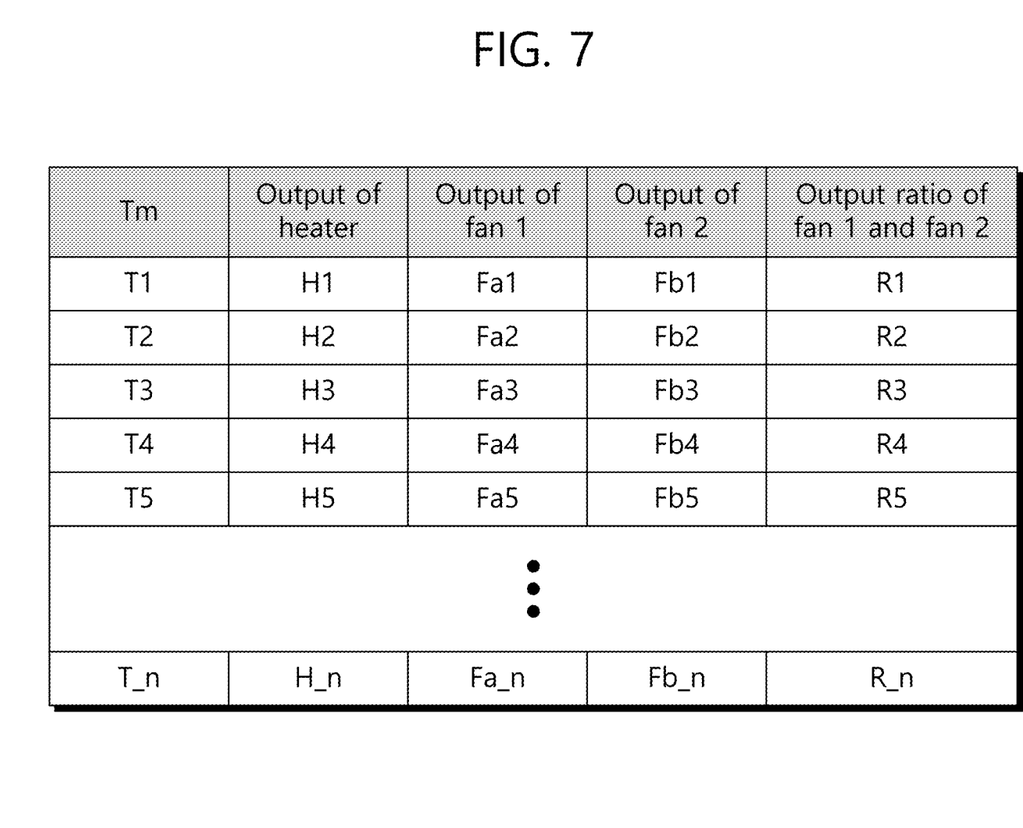
FIG. 7 is a correlation table illustrating correlation factors corresponding to one memory module according to an example embodiment.

FIG. 6 is a flowchart illustrating a life cycle management method of a high temperature test device according to an example embodiment. The life cycle management method of FIG. 6 may be applied to the high temperature test device 1000 of FIG. 1 or the high temperature test device 2000 of FIG. 5. FIG. 7 is a correlation table illustrating correlation factors corresponding to one memory module according to an example embodiment. Referring to FIGS. 6 and 7, a high temperature test device (for example, the high temperature test device 1000 of FIG. 1 or the high temperature test device 2000 of FIG. 5) may generate a correlation table to manage configurations of the high temperature test device.

According to an example embodiment, in operation S310, a temperature controller (for example, the temperature controller 1100 of FIG. 2) may periodically receive a module temperature of the memory module (for example, the memory module 20 of FIG. 2) through a main board (for example, the main board 10 of FIG. 2). In operation S320, the temperature controller may control the module temperature during a mounting test of the memory module.

According to an example embodiment, in operation S330, the temperature controller may generate a correlation table during the mounting test. As an example, referring to FIG. 7, the temperature controller may record a module temperature change for one memory module and store an output of a heater (for example, the heater 1200 of FIG. 2) corresponding to each module temperature, an output of the first fan (for example, the first fan 1310 of FIG. 2 or the plurality of intake fans 2311, 2312, 2313 and 2314 of FIG. 5), an output of the second fan (for example, the second fan 1320 in FIG. 2 or the plurality of exhaust fans 2321, 2322, 2323 and 2324 of FIG. 5) or an output ratio between the first fan and the second fan. As another example, the temperature controller may record a temperature deviation for each memory module or each memory module group. The temperature deviation for each memory module or each memory module group may be used to improve a structure or control capability of the temperature controller.

According to an example embodiment, in operation S340, the temperature controller may manage life cycles of components of the high temperature test device based on the correlation table. As an example, the temperature controller may display replacement timing of the heater, the first fan or the second fan. As another example, a memory module group in which an abnormal temperature is concentrated may be identified through the correlation table. A high temperature test device in which a high temperature as the abnormal temperature is measured may be used to test a low-capacity memory module. A high temperature test device in which a low temperature as the abnormal temperature is measured may be used to test a high-capacity memory module. As another example, a change in temperature control performance according to the number of mounting tests may be obtained/confirmed based on the number of the mounting tests and temperature information of the high temperature test device. Accordingly, a use/replacement cycle of the high temperature test device may be obtained/set. Therefore, the high temperature test device may be maintained in an optimal state by predicting an appropriate maintenance time.

According to an example embodiment, in operation S350, the temperature controller may update the output ratio of the first fan and the second fan based on the correlation table. For example, the temperature controller may find an output ratio of the first fan and the second fan that is optimal to adjust the module temperature by a unit temperature based on the correlation table.

According to the present disclosure, the high temperature test device may finely adjust the module temperature of the memory module during the mounting test.

According to the present disclosure, the high temperature test device may maintain a constant module temperature of the memory module during the mounting test regardless of a capacity or a self-heating value of the memory module.

According to the present disclosure, the high temperature test device may directly receive the module temperature of the memory module from the main board on which the memory module is mounted and monitor the module temperature of the memory module in real time.

According to the present disclosure, the high temperature test device may manage a life cycle of the high temperature test device through monitoring states of configurations of the high temperature test device.

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context clearly indicates otherwise, and the present disclosure includes the additional embodiments.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A high temperature test device of a memory module comprising:
    an airtight housing configured to seal the memory module mounted on a main board;
    a heater disposed above the main board inside the airtight housing;
    a first fan disposed on an upper portion of the airtight housing above the heater and configured to send heat from the heater to the memory module;
    a second fan disposed on the upper portion of the airtight housing and configured to send air inside the airtight housing to the outside of the airtight housing; and
    a temperature controller configured to adjust an output ratio of the first fan to the second fan during a mounting test of the memory module to manage a module temperature of the memory module to be maintained within a specified range,
    wherein the temperature controller is configured to periodically receive the module temperature from the main board, and adjust the output ratio of the first fan to the second fan based on a deviation between the module temperature and a target temperature.

2. The high temperature test device of claim 1, wherein the temperature controller is configured to read the module temperature from a register of a central processing unit mounted on the main board by using a temperature confirmation tool without involving a test controller.

3. The high temperature test device of claim 1, wherein the temperature controller is configured to increase a first output ratio of the first fan to the second fan or increase an output of the heater when the module temperature is less than a first reference temperature.

4. The high temperature test device of claim 3, wherein the temperature controller is configured to increase a second output ratio of the second fan to the first fan or decrease the output of the heater when the module temperature exceeds a second reference temperature.

5. The high temperature test device of claim 4, wherein the temperature controller is configured to maintain the same output ratio of the first fan to the second fan when the module temperature is equal to or higher than the first reference temperature and equal to or lower than the second reference temperature.

6. A high temperature test device of a memory module comprising:
    an airtight housing configured to seal the memory module mounted on a main board;
    a heater disposed above the main board inside the airtight housing;
    a first fan disposed on an upper portion of the airtight housing above the heater and configured to send heat from the heater to the memory module;
    a second fan disposed on the upper portion of the airtight housing and configured to send air inside the airtight housing to the outside of the airtight housing; and
    a temperature controller configured to control the heater, the first fan and the second fan during a mounting test of the memory module to manage a module temperature of the memory module to be maintained within a specified range,
wherein the temperature controller is configured to store a correlation table corresponding to a change in at least one of outputs of the heater, the first fan and the second fan, and a change in the module temperature.

7. The high temperature test device of claim 6, wherein the temperature controller is configured to manage a life cycle of the heater, the first fan or the second fan based on the correlation table.

8. The high temperature test device of claim 6, wherein the temperature controller is configured to display a replacement time of the heater, the first fan or the second fan based on the correlation table.

9. The high temperature test device of claim 6, wherein the temperature controller is configured to update output ratio adjustment values of the first fan to the second fan according to the module temperature based on the correlation table.

10. The high temperature test device of claim 6, wherein the temperature controller is configured to periodically receive the module temperature from the main board and read the module temperature from a register of a central processing unit mounted on the main board using a temperature confirmation tool without involving a test controller.

11. The high temperature test device of claim 6, wherein the temperature controller is configured to adjust output ratio of the first fan to the second fan to control the module temperature.

12. The high temperature test device of claim 6, wherein the temperature controller is configured to increase a first output of the first fan or increase an output of the heater when the module temperature is less than a first reference temperature.

13. The high temperature test device of claim 12, wherein the temperature controller is configured to increase a second output of the second fan or decrease the output of the heater when the module temperature exceeds a second reference temperature.

14. The high temperature test device of claim 13, wherein the temperature controller is configured to maintain the same output ratio of the first fan to the second fan when the module temperature is equal to or higher than the first reference temperature and equal to or lower than the second reference temperature.

15. A module temperature control method of a high temperature test device controlling a temperature of a memory module during a mounting test, the method comprising:
receiving a target temperature from a test controller;
raising a module temperature of the memory module to the target temperature through a heater disposed above the memory module;
periodically receiving the module temperature from a main board on which the memory module is mounted;
increasing an output of a first fan supplying air to the memory module through the heater when the module temperature is less than a first reference temperature;
increasing an output of a second fan circulating air inside an airtight housing configured to seal the memory module to the outside of the airtight housing when the module temperature exceeds a second reference temperature; and
maintaining outputs of the first fan and the second fan identically when the module temperature is greater than or equal to the first reference temperature and less than or equal to the second reference temperature.

16. The method of claim 15, wherein the first fan and the second fan are disposed at an upper portion of the airtight housing, and the heater is disposed between the first fan and the memory module.

17. The method of claim 15, wherein the periodically receiving the module temperature comprises receiving the module temperature in units of 1 second.

18. The method of claim 15, further comprising increasing the output of the heater.

19. The method of claim 15, further comprising storing the module temperature at regular time intervals.

20. The method of claim 15, further comprising:
storing a correlation table corresponding to at least one of outputs of the heater, the first fan and the second fan, and a change in the module temperature.

* * * * *